United States Patent [19]

Donohue

[11] Patent Number: 5,079,193
[45] Date of Patent: Jan. 7, 1992

[54] ENCAPSULANT COMPOSITION

[75] Inventor: Paul C. Donohue, Wilmington, Del.

[73] Assignee: E. I. Du Pont de Nemours and Company, Wilmington, Del.

[21] Appl. No.: 560,866

[22] Filed: Jul. 31, 1990

Related U.S. Application Data

[60] Division of Ser. No. 403,835, Aug. 11, 1989, Pat. No. 4,966,926, which is a continuation-in-part of Ser. No. 240,357, Aug. 1, 1988, which is a continuation-in-part of Ser. No. 182,114, Apr. 15, 1988, abandoned.

[51] Int. Cl.$^5$ .......................... C03C 8/24; C03C 8/16; C08K 9/10; C08K 3/20
[52] U.S. Cl. .......................... 501/15; 264/63; 361/320; 361/321; 428/403; 428/426; 501/17; 501/20; 501/61; 501/76; 523/210; 523/214; 524/317; 524/381; 524/383; 524/405; 524/432; 524/434; 524/560
[58] Field of Search ............ 524/405, 317, , 381, 524/383, 386, 432, 434, 560; 523/210, 214; 501/15, 20, 17, 61, 75, 76; 264/63; 428/426, 403; 361/321, 322

[56] References Cited

U.S. PATENT DOCUMENTS

| 3,088,833 | 5/1963 | Pirooz | 501/76 |
| 3,088,834 | 5/1963 | Pirooz | 501/76 |
| 3,088,835 | 5/1963 | Pirooz | 501/76 |
| 3,113,878 | 12/1963 | Martin | 501/5 |
| 3,975,201 | 8/1976 | Greenstein | 524/577 |
| 4,010,133 | 3/1977 | Nakayama | 524/413 |
| 4,353,958 | 10/1982 | Kita et al. | 428/403 |
| 4,492,783 | 1/1985 | Tanaka et al. | 524/432 |
| 4,536,535 | 8/1985 | Usala | 524/560 |
| 4,613,648 | 9/1983 | Usala | 524/560 |
| 4,641,221 | 2/1983 | Khovry et al. | 361/321 |
| 4,752,531 | 6/1988 | Steinberg | 428/426 |
| 4,766,027 | 8/1988 | Burn | 428/210 |
| 4,816,072 | 3/1989 | Harley et al. | 264/63 |
| 4,849,380 | 7/1989 | Sawhill | 501/66 |
| 4,867,935 | 9/1989 | Morrison, Jr. | 264/63 |
| 4,959,330 | 9/1990 | Donohue | 501/20 |
| 4,966,926 | 10/1990 | Donohue | 524/405 |

Primary Examiner—Herbert J. Lilling

[57] ABSTRACT

An encapsulant composition comprising a lead zinc silicoborate glass which forms a crystalline phase of $Zn_2SiO_4$ and $ZnB_2O_4$ when it is fired at 650°–800° C.

1 Claim, No Drawings

ENCAPSULANT COMPOSITION

CROSS-REFERENCE TO RELATED APPLICATION

This is a division of application Ser. No. 07/403,835, filed Aug. 11, 1989, now U.S. Pat. No. 4,966,926, which is a continuation-in-part of co-pending U.S. patent application Ser. No. 07/240,357, filed Aug. 1, 1988, which is a continuation-in-part of U.S. patent application Ser. No. 07/182,114, filed Apr. 15, 1988 and now abandoned.

FIELD OF INVENTION

The invention relates to encapsulant compositions and, in particular, to those which are fireable in low oxygen-containing atmospheres.

BACKGROUND OF THE INVENTION

Hybrid circuits based on copper and compatible resistors should be encapsulated to insure resistor durability in humid atmospheres. Furthermore, manufacturers prefer glass encapsulation to protect the copper from long-term corrosion. Only contact pads are soldered.

The encapsulant system must exhibit several features which are difficult to achieve together. It must form a bubble-free seal at low enough firing temperature to prevent shift of the underlying resistors. If the glass flows too much, it will diffuse into the resistor and shift the value upward. If it does not flow enough, it will not seal. The organic vehicle necessary for screen printing must burn out in nitrogen at this low temperature and the surrounding copper must remain stain-free to allow solder acceptance. Copper will form an oxide stain at low temperature which will disappear when fired at higher temperature (~600° C.) in nitrogen.

Thus an ideal encapsulant should screen print smoothly and rapidly with a vehicle which is decomposable in a low oxygen-containing atmosphere such as nitrogen at a low enough temperature to allow the glass to flow sufficiently to form a seal, but not so much as to shift the resistors. Furthermore, the firing temperature should be high enough to remove any oxide which forms on the copper conductors.

A previous attempt to combine these features was the subject of U.S. patent application Ser. No. 12,133, filed Feb. 6, 1987 in which $Pb(NO_3)_2$ was used to coat low melting glass and burn out the vehicle at low firing temperature. The low melting glass formed a good seal without excessive resistor shift. A problem with this approach is, however, that excess oxidizing agent [$Pb(NO_3)_2$] required for complete vehicle removal and bubble-free film formation may also oxidize the copper and thus form an unsolderable stain. On the other hand, higher temperature firing which would remove the stain causes excess glass flow and consequently resistor shift.

SUMMARY OF THE INVENTION

The invention is therefore directed in its most general aspect to an encapsulant composition comprising finely divided particles of a crystallizable glass consisting essentially, by weight, of 20–65% ZnO, 10–22% $B_2O_3$, 13–40% $SiO_2$ and 3–46% PbO dispersed in an organic medium comprising an organic polymer dissolved in organic solvent.

By adjustment of the volatility of the solvent and the rheological properties of the polymer composition, the composition of the invention can be used to form green tapes or it can be applied as a printable thick film paste.

PRIOR ART

The closest prior art of which applicant is aware at the time of filing this application consists of U.S. Pat. No. 3,088,834 to Pirooz and U.S. Pat. No. 3,113,878 to Martin.

The Pirooz patent is directed to a crystallizable sealing glass composition containing 38–42% wt. ZnO, 10–14% wt. $SiO_2$, 11–29% wt. PbO, 9–13% copper oxide, and up to 5% wt. of other glass-forming oxides such as $B_2O_3$. The copper oxide is indicated to be essential for the purpose of adjusting the temperature coefficient of expansion of the composition.

The Martin patent is directed to a crystallizable zinc silicoborate glass consisting of 60–70% ZnO, 19–25% $B_2O_3$ and 10–16% $SiO_2$ and optionally "minor amounts" of glass-forming materials such as PbO, $As_2O_3$ and $Sb_2O_3$ and colorants. In particular, a glass is disclosed containing 60% ZnO, 22.5% $B_2O_3$, 12.5% $SiO_2$ and 5% PbO (Example 7). The glass is disclosed to be useful as a sealing glass for preformed materials having a temperature Coefficient of Expansion (TCE) of $30-50 \times 10^{-7}$.

DETAILED DESCRIPTION OF THE INVENTION

A. Crystallizing Glass

Because the encapsulant composition of the invention is used with fired resistors, it is necessary that the glass component be fired at a relatively low temperature such that the glass will incur only a minimum amount of diffusion into the resistor structure thereby minimizing interaction with the resistor. Thus the glass component of the encapsulant composition of the invention has been designed for use at a firing temperature of about 580°–685° C. The glass sinters at 500°–600° C., has a gloss temperature of 550°–660° C. and crystallizes at a temperature above 650°, e.g., between 650° and 800° C.

It has been found that complete crystallization of a separate phase throughout the encapsulated mass is not necessary. It is necessary only that crystallization take place at the interface of the fired resistor and the encapsulant layer in order to minimize glass flow at the interface. The crystallized glass phase has been determined to be a mixture of $ZnB_2O_4$ and $Zn_2SiO_4$, which, of course, has a different composition than both the parent glass and the remainder glass.

A key component of the glass of the invention is the ZnO, a glass modifier, which must be present in a concentration of 20–65% wt. of the glass. At least 20% wt. ZnO is required to assure that the amount of crystallization is sufficient. On the other hand, if more than 65% wt. ZnO is used, the sealing glass may not be completely amorphous and therefore not yield sufficient hermeticity. For higher melting glasses, 60–65% wt. ZnO is preferred and for lower melting glasses, 30–50% wt. ZnO is preferred.

The amount of $B_2O_3$ in the composition is important and at least 17% at. $B_2O_3$ is needed to adjust the gloss temperature downward. However, no more than about 22% wt. should be used lest the glass incur blistering during the firing step. From 18 to 20% wt. $B_2O_3$ is therefore preferred.

At least about 13% wt. $SiO_2$ is needed to obtain the amount of durability (insolubility and hermeticity) which is required for the glass to be an effective encapsulant; but if more than about 17% wt. SiO$_2$ is used, the gloss temperature of the glass is likely to become too high. From 14 to 16% SiO$_2$ is preferred.

The amount of PbO in the encapsulant glass is important from the standpoint of the rheology of the glass during sintering. Thus a relatively small amount of PbO is needed to enable the glass to flow freely at about 600° C. Nevertheless, the amount of PbO should be minimized because of the tendency of PbO to be reduced during firing under low oxygen atmospheric conditions.

It will be recognized that the use of reducible oxides should in general be avoided except for the needed amount of PbO. The reason for this is that the metals which are formed by reduction during firing will make the encapsulant composition conductive and therefore incur interaction with the underlying resistance layer. It is especially important that the glass component of the encapsulant contain essentially no copper oxide for the reason that it tends to become reduced, dissolve in the composition and thus to render the composition conductive and therefore unsuitable as an encapsulant. In addition, when copper oxide is present the composition films become discolored due to reduction of the copper oxide to metallic copper during the firing process.

For higher melting glasses, 3–6% wt. PbO is preferred and for lower melting glasses 17–46% wt. PbO is preferred. A particularly preferred higher melting glass composition for use in the invention contains 61.2% ZnO, 18.4% B$_2$O$_3$, 15.3% SiO$_2$ and 5.1% PbO and a particularly preferred low melting glass contains 30.6% ZnO, 18.4% B$_2$O$_3$, 15.3% wt. SiO$_2$ and 35.7% PbO.

The surface area of the glass is not critical but is preferably in the range of 1.5–4 m$^2$/g. Assuming a density of approximately 3–4 g/cm$^2$, this range corresponds to an approximate particle size range of 0.5–1 micron. A surface area of 1.5 m$^2$/g (approx. 1.3 micron) can also be utilized. The preparation of such glass frits is well known and consists, for example, in melting together the constituents of the glass in the form of the oxides of the constituents and pouring such molten composition into water to form the frit. The batch ingredients may, of course, be any compound that will yield the desired oxides under the usual conditions of frit production. For example, boric oxide will be obtained from boric acid, silicon dioxide will be produced from flint, barium oxide will be produced from barium carbonate, etc. The glass is preferably milled in a ball mill with water to reduce the particle size of the frit and to obtain a frit of substantially uniform size.

The glasses are prepared by conventional glassmaking techniques by mixing the desired components in the desired proportions and heating the mixture to form a melt. As is well known in the art, heating is conducted to a peak temperature and for a time such that the melt becomes entirely liquid and homogeneous. In the present work, the components are premixed by shaking in a polyethylene jar with plastic balls and then melted in a platinum crucible at the desired temperature. The melt is heated at the peak temperature for a period of 1–1½ hours. The melt is then poured into cold water. The maximum temperature of the water during quenching is kept as low as possible by increasing the volume of water to melt ratio. The crude frit after separation from water is freed from residual water by drying in air or by displacing the water by rinsing with methanol. The crude frit is then ball milled in water for 3–5 hours in alumina containers using alumina balls. Alumina picked up by the materials, if any, is not within the observable limit as measured by X-ray diffraction analysis.

After discharging the milled frit slurry from the mill, the excess solvent is removed by decantation and the frit powder is air dried at room temperature. The dried powder is then screened through a 325-mesh screen to remove any large particles.

It is preferred that the encapsulant glass compositions of the invention contain only the four basic metal oxides discussed hereinabove. It is further preferred that the compositions of the invention contain essentially no copper oxide modifying oxides other than PbO and ZnO. Nevertheless, it is recognized that small amounts, up to 5% wt., of other glass modifying oxides such as alumina, alkali metal oxides and alkaline earth metal oxides can be added to the encapsulant compositions without changing their essential character.

B. Organic Medium

Organic medium suitable for use in the invention are selected according to the physical form in which the encapsulant compositions are applied. In particular, the encapsulant glass frit can be applied as a thick film paste by screen printing and it can also be applied as a green tape.

When the encapsulant is applied by screen printing, the particles thereof are mixed with an inert liquid medium (vehicle) by mechanical mixing (e.g., on a roll mill) to form a pastelike composition having suitable consistency and rheology for screen printing. The latter is printed as a "thick film" in the conventional manner.

The main purpose of the organic medium is to serve as a vehicle for dispersion of the finely divided solids of the composition in such form that it can readily be applied to ceramic or other substrates. Thus the organic medium must first of all be one in which the solids are dispersible with an adequate degree of stability. Secondly, the rheological properties of the organic medium must be such that they lend good application properties to the dispersion.

Most thick film compositions are applied to a substrate by means of screen printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wettability of the solids and the substrate, good drying rate, dried film strength sufficient to withstand rough handling, and good firing properties. Satisfactory appearance of the fired composition is also important.

In view of all these criteria, a wide variety of liquids can be used as organic medium. The organic medium for most thick film compositions is typically a solution of resin in a solvent frequently also containing thixotropic agents and wetting agents. The solvents usually boil within the range of 130°–350° C.

Suitable solvents include kerosene, mineral spirits, dibutylphthalate, butyl Carbitol, butyl Carbitol acetate, hexylene glycol and high boiling alcohols and alcohol esters. Various combinations of these and other solvents are formulated to obtain the desired viscosity and volatility.

By far the most frequently used and a frequently preferred resin for this purpose is ethyl cellulose. However, resins such as ethylhydroxyethyl cellulose, wood rosin, mixtures of ethyl cellulose and phenolic resins, polymethacrylates of lower alcohols and monobutyl ether of ethylene glycol monoacetate can also be used.

In the past, poly(alpha-methyl sytrene) has been utilized as a resin for thick film applications because of its excellent burn-out properties. However, poly(alphamethyl styrene) has not been widely used because thick film pastes made therewith have exhibited very poor rheological properties. It has, however, been found when the encapsulant composition of the invention are formulated as thick film pastes using poly(alpha-methyl styrene) dissolved in dibutyl carbitol, the resulting paste has quite good rheological properties for screen printing. Thus, a preferred organic medium for formulating the encapsulant composition of the invention as a thick film paste is a solution of 20-60% wt. poly(alpha-methyl styrene) and 80-40% wt. dibutyl carbitol and preferably 45-55% wt. poly(alpha-methyl styrene) and 55-45% wt. dibutyl carbitol.

Among the thixotropic agents which are commonly used are hydrogenated castor oil and derivatives thereof and ethyl cellulose. It is, of course, not always necessary to incorporate a thixotropic agent since the solvent resin properties coupled with the shear thinning inherent in any suspension may alone be suitable in this regard. Suitable wetting agents include phosphate esters and soya lecithin.

The ratio of organic medium to solids in the paste dispersions can vary considerably and depends upon the manner in which the dispersion is to be applied and the kind of organic medium used. Normally, to achieve good coverage, the dispersions will contain complementally by weight 40-90% solids and 60-10% organic medium.

The pastes are conveniently prepared on medium (vehicle) utilized is determined mainly by the final desired formulation viscosity and print thickness.

The encapsulant compositions of the invention can also be easily used for the manufacture of green tape by the conventional method of slip casting a slurry of the glass particles dispersed in a solution of binder polymer, plasticizer and volatile solvent onto a flexible carrier such as polypropylene or Mylar ® polyester film or stainless steel, adjusting the thickness of the cast film by passing the cast slurry under a doctor blade and then heating the doctored slurry to remove the volatile solvent from the layer by evaporation. The solid layer of solids dispersed in a matrix of polymeric binder is removed from the carrier and slit to appropriate widths for use in making multilayer structures. Green tapes of this kind generally have a thickness of 3 to 15 mils.

A wide variety of polymeric materials can be used as the binder for green tape such as poly (vinyl butyral), poly (vinyl acetate), poly (vinyl alcohol), cellulosic polymers such as methyl cellulose, ethyl cellulose, hydroxyethyl cellulose, methylhydroxyethyl cellulose, atactic polypropylene, polyethylene, silicon polymers such as poly (methyl siloxane), poly (methylphenyl siloxane), polysytrene, butadiene/styrene copolymer, polystyrene, poly (vinyl pyrrolidone), polyamides, high molecular weight polyethers, copolymers of ethylene oxide and propylene oxide, polyacrylamides, and various acrylic polymers such as sodium polyacrylate, poly (lower alkyl acrylates), poly (lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid.

a preferred class of polymeric binders for making green tapes for the composition of the invention are those disclosed by Usala in U.S. Pat. No. 4,613,648. These polymeric binders are a mixture of compatible multipolymers of 0-100% wt. $C_{1-8}$ alkyl methacrylate, 100-0% wt. $C_{1-8}$ alkyl acrylate, and 0-5% wt. ethylenically unsaturated carboxylic acid or amine, the multipolymer being further characterized as having a number average molecular weight ($M_n$) of 50,000 to 100,000, a weight average molecular weight ($M_w$) of 150,000 to 350,000, the ratio of $M_w$ to $M_n$ being no greater than 5.5, the total amount of unsaturated carboxylic acid or amine in the multipolymer mixture is 0.2-2.0% wt., and the glass transition temperature of the polymer and plasticizer therein, if any, is $-30°$ to $+45°$ C.

The organic medium in which the ceramic solids are dispersed contains principally the polymeric binder dissolved in organic solvent. However, the medium may contain other dissolved materials such as plasticizers, release agents, dispersing agents, thixotropic agents, stripping agents, antifouling agents and wetting agents.

It will be recognized that by adjusting the rheological properties of the dispersions of the invention and by changing the solvent component of the organic medium, the invention compositions can be applied to substrates by other methods than casting, e.g., by screen printing. When the compositions are applied by screen printing, the conventional organic media materials used for thick film materials can be used so long as the acrylic polymers are completely soluble therein at application temperatures.

For casting solutions, the solvent component of the organic medium is chosen so as to obtain complete solution therein of the polymer and sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include benzene, acetone, xylene, methanol, ethanol, methylethyl ketone, 1,1,1-trichloroethane, tetrachloroethylene, amyl acetate, 2,2,4-triethylpentanediol-1,3-mono isobutyrate, toluene, methylene chloride, 2-propanol and Freon ® TF (trichlorotrifluoroethane).

C. Test Procedures

Laser Trim Stability - Laser trimming of thick film resistors is an important technique for the produciton of hybrid microelectronic circuits. [A discussion can be found in *Thick Film Hybrid Microcircuit Technology* by D. W. Hamer and J. V. Biggers (Wiley, 1972, p. 173 ff.] Its use can be understood by considering that the resistances of a particular resistor printed with the same resistive ink on a group of substrates has a Gaussian-like distribution. To make all the resistors have the same design value for proper circuit performance, a laser is used to trim resistances up by removing (vaporizing) a small portion of the resistor material. The stability of the trimmed resistor is then a measure of the fractional change in resistance that occurs after laser trimming. Low resistance change - high stability - is necessary so that the resistance remains close to its design value for proper circuit performance.

Shift on Aging at 150° C. - After initial measurement of resistance at room temperature, the resistor is placed into a heating cabinet at 150° C. in dry air and held at that temperature for a specified time (usually 1,000 hours). At the end of the specified time, the resistor is removed and allowed to cool to room temperature. The resistance is again measured and the change in resistance calculated by comparison with the initial resistance measurement.

Hermeticity - This test is performed in the same manner as the preceding Shift on Aging Test, except that the air within the heating cabinet is maintained at 85% relative humidity (RH) at 85° C. (85% RH/85° C.).

Resistance Measurement and Calculations - The test substrates are mounted on terminal posts within a controlled temperature chamber and electrically connected to a digital ohm-meter. The temperature in the chamber is adjusted and allowed to equilibrate, after which the resistance of the test resistor on each substrate is measured and recorded.

EXAMPLES

EXAMPLE 1—Glass Preparation

A crystallizable glass was prepared having the preferred composition indicated below by heating a mixture of the metal oxides (an equivalent amount of $H_3BO_3$ in the case of $B_2O_3$) in a platinum crucible for one hour at 1400° C. The glass was fritted by pouring it into water. The frit was then ball milled in water for 15 hours to effect particle size reduction sufficient for the preparation of a thick film paste. By subjecting the finely divided glass to a temperature gradient, it was shown that the glass sintered at about 575° C., glossed at about 600°–660° C. and crystallized above 660° C. Analysis by X-ray powder diffraction of the glass after it had been fired at 700° C. indicated the formation of at least one crystalline phase. The composition of the parent glass by weight was as follows: ZnO 61.2%; $B_2O_3$ 18.4%; $SiO_2$ 15.3%; PbO 5.1%.

EXAMPLE 2

A thick film encapsulant composition was made by dispersing the glass of Example 1 in an organic medium consisting of 96% wt. beta-terpineol as solvent and 4% wt. ethyl cellulose as polymeric binder. A paste containing $Ba(NO_3)_2$ to aid burn-out of organics was also blended into the dispersion. The resultant paste mixture was screen printed over a fired substrate having copper circuitry and lanthanum hexaboride resistors. The printed encapsulant layer was dried and then fired in a $N_2$ atmosphere to a peak temperature of 660° C. (10 minutes) in a belt furnace. The film was smooth and blister-free and the underlying copper circuitry was stain-free. In addition, the resistance values of the resistors had shifted only slightly.

EXAMPLES 3-5

The glass frit of Example 1 was roll-milled to form a thick film paste having the composition by wt. of 72.3% glass frit, 1.2% $TiO_2$, 2.4% $Cr_2O_3$ and 24.1% of an organic medium consisting of 15% poly(methylmethacrylate)dissolved in 85% butyl Carbitol acetate. The composition was screen-printed over a series of three nitrogen-fired 40× 40 mil resistors and fired in a nitrogen atmosphere to a peak temperature of 660° C. (10 minutes) in a belt furnace. The underlying resistors were laser trimmed through the fired encapsulant to 1.5 times their original resistance value and subjected to accelerated aging (1000 hours). Their properties were measured to compare the encapsulated and unencapsulated areas of the resistors. As shown by the data in Table 1 which follows, the encapsulated resistors exhibited quite low resistance shift and improved stability.

TABLE 1

Effect of Encapsulation on Resistance Shift

| | Example No. | | |
|---|---|---|---|
| | 3 | 4 | 5 |
| Type of Resistor | $LaB_6$[1] | Pyrochlore[2] | Pyrochlore[2] |
| Nominal Resistance $K\Omega/\square$ | 10 | 10 | 10 |
| Resistance Shifts, % | | | |
| Encapsulated Resistors | | | |
| Untrimmed, No Aging[3] | 1.2 | 0.5 | 1.4 |
| Laser Trimmed, 1000 hours | | | |
| Ambient Conditions | 0.09 | 0.22 | 0.22 |
| 85° C./85% RH | 0.33 | 2.47 | 2.50 |
| 150° C. | 0.40 | 0.45 | 0.52 |
| Unencapsulated Resistors | | | |
| Laser Trimmed, 1000 hours | | | |
| Ambient Conditions | 0.11 | 0.24 | 0.32 |
| 85° C./85% RH | 0.93 | 5.60 | 5.50 |
| 150° C. | 0.44 | 0.59 | 0.51 |

[1] See Donohue, U.S. Pat. No. 4,512,917
[2] See Hormadaly, U.S. Pat. Nos. 4,548,741 and 4,613,539
[3] Resistance shift due to encapsulation alone.

EXAMPLES 6-11

A glass having the same composition as the glass of Example 1 was prepared in the same manner and ball milled to a surface area of 1.72 m²/g. A thick film paste was then prepared in the same manner as Example 2 and that paste was printed over a series of six previously fired resistors having copper terminations. Four of the resistors were $LaB_6$-based resistors having resistance values of $1\Omega/\square$ through $10 K\Omega/\square$. Two of the resistors were pyrochlore-based resistors ($SnO/SnO_2/Ta_2O_5$) having a resistance value of 10K and $100K\Omega/\square$. The encapsulant paste was fired in a nitrogen atmosphere in a belt furnace at 675° C. with 8 minutes at the peak temperature. No stain was observed on the copper areas. Moreover, the copper areas readily accepted solder when they were subjected to normal solder dipping operations.

The six resistors were then remeasured after encapsulation to determine the amount of resistance shift, and the high end resistors (i.e., resistance equal to or greater than 10K) were laser trimmed since they are usually the most sensitive with respect to the effectiveness of encapsulants. As shown by the data in Table 2, those resistors underwent very little resistance shift and had very good encapsulation.

TABLE 2

Effect of Encapsulation On Resistance Shift and Stability

| | Example No. | | | | | |
|---|---|---|---|---|---|---|
| | 6 | 7 | 8 | 9 | 10 | 11 |
| Type of Resistor | $LaB_6$ | $LaB_6$ | $LaB_6$ | $LaB_6$ | Pyrochlore | Pyrochlore |

TABLE 2-continued

Effect of Encapsulation On Resistance Shift and Stability

| | Example No. | | | | | |
|---|---|---|---|---|---|---|
| | 6 | 7 | 8 | 9 | 10 | 11 |
| Nominal Resistance, $K\Omega/\square$ | 10 | 100 | 1 | 10 | 10 | 10 |
| Resistance Shifts, % | | | | | | |
| Encapsulated Resistors | | | | | | |
| Untrimmed, No Aging | 1.9 | −1.5 | 3.8 | 1.6 | 0.4 | 0.6 |
| Laser Trimmed, 1000 hours | | | | | | |
| Ambient Conditions | — | — | — | 0.09 | 0.28 | 0.22 |
| 85° C./85% RH | — | — | — | 0.33 | 0.75 | 0.70 |
| 150° C. | — | — | — | 0.40 | 0.63 | 0.08 |
| Unencapsulated Resistors | | | | | | |
| Laser Trimmed, 1000 hours | | | | | | |
| Ambient Conditions | — | — | — | 0.11 | 0.24 | 0.22 |
| 85° C./85% RH | — | — | — | 0.98 | 2.85 | 4.48 |
| 150° C. | — | — | — | 0.44 | 0.57 | 0.57 |

EXAMPLES 12-15

A glass frit and screen-printable paste were prepared in accordance with the procedures of Examples 1 and 2 and were used to encapsulate duplicate sets of fired resistors. For one set, the encapsulant was fired at 660° C. and for the other set the encapsulant was fired at 675° C. The resistors were not laser trimmed. The data in Table 3 shown that the higher firing temperature resulted in substantially less resistance shift when applied to the pyrochlore-type resistors but did not significantly affect the resistance shift of the lanthanum boride-type resistors.

TABLE 3

Effect of Firing Temperature on Resistance Shift

| | Example No. | | | |
|---|---|---|---|---|
| | 12 | 13 | 14 | 15 |
| Type of Resistor | $LaB_6$ | $LaB_6$ | Pyrochlore | Pyrochlore |
| Nominal Resistance, $K\Omega/\square$ | 1 | 10 | 10 | 100 |
| Resistance Shifts, % | | | | |
| At 660° C. Firing | — | 1.69 | 1.63 | 0.91 |
| At 675° C. Firing | 3.8 | 2.7 | 0.35 | 0.62 |

EXAMPLES 16 and 17

A series of pyrochlore-type resistors was prepared in which part were encapsulated by the encapsulant composition of Example 2 and fired at 660° C. Part were encapsulated by the encapsulant composition of Example 2 and fired at 675° C. and part were not encapsulated. All of the resistors were then trimmed to 1.5 x resistance value and tested for resistance shift after 400 hours of aging at ambient (room temperature) conditions, 85° C./85% RH and at 150° C. None of the circuits exhibited any copper staining. The data in Table 4 below show that the resistors fired at 675° C. were more highly hermetic than those fired at 660° C.

TABLE 4

Effect of Firing Temperature On Hermeticity of Resistors

| | Example No. | |
|---|---|---|
| | 16 | 17 |
| Encapsulant Firing Temperature | 660° C. | 675° C. |
| Resistance Shift, Encapsulated | | |
| RT | 0.31 | 0.27 |
| 85° C./85% RH | 1.86 | 1.10 |
| 150° C. | 0.69 | 0.63 |
| Uncapsulated | | |
| RT | 0.32 | 0.35 |
| 85° C./85% RH | 5.8 | 5.1 |
| 150° C. | 0.59 | 0.58 |

EXAMPLES 18-21

Three further series of fired resistors were prepared in the same manner as Examples 12-15. One series of the resistors was encapsulated with the composition of Example 2 by firing at 675° C. and another series of the resistors was encapsulated with a low melting, high lead borosilicate glass by firing at 480° C. See Examples 2 and 3 of U.S. patent application Ser. No. 12,133 filed Feb. 6, 1987. The copper staining and resistance shift of each of the encapsulated resistors were then observed and are recorded in Table 5 below.

TABLE 5

Comparison of Crystallizing and Low Melting Vitreous Glass Encapsulants

| | Example No. | | | |
|---|---|---|---|---|
| | 18 | 19 | 20 | 21 |
| Type of Resistor | $LaB_6$ | $LaB_6$ | Pyrochlore | Pyrochlore |
| Nominal Resistance, $K\Omega/\square$ | 1 | 10 | 10 | 100 |
| Resistance Stability | | | | |
| Crystallizing Glass, Encapsulated | | | | |
| Resistance Shift, % | 3.8 | 2.7 | 0.35 | 0.62 |
| Stain | None | None | None | None |
| Low Melting Glass, Encapsulated | | | | |
| Resistance Shift, % | 7.3 | 6.6 | 5.3 | 10.6 |
| Stain | Yes | Yes | Yes | Yes |

The data in Table 5 show that the encapsulant composition of the invention was far superior both with respect to resistance shift which was much lower and copper staining, of which there was none.

EXAMPLE 22-25

The unencapsulated resistors of Examples 18-21 were compared with the identical resistors of Examples 18-21 which had been encapsulated with the encapsulant composition of Example 2.

When the resistance shift of all three series of resistors was measured after they had been immersed in water for 100 hours, it was found that none of the lanthanum boride-based resistors (Examples 18 and 19) incurred any further shift in resistance and that the encapsulated pyrochlore-based resistors underwent only a very small amount of shift.

TABLE 6

Effect of Water Immersion on Resistance Shift of Encapsulated Resistors

| | Example No. | | | |
|---|---|---|---|---|
| | 18 | 19 | 20 | 21 |
| Type of Resistor | $LaB_6$ | $LaB_6$ | Pyrochlore | Pyrochlore |
| Nominal Resistance, $K\Omega/\square$ | 1 | 10 | 10 | 10 |
| Resistance Shifts, | | | | |
| Crystallizing Glass, Encapsulated | None | None | 0.51 | 0.34 |
| Low Melting Glass, Encapsulated | None | None | 0.71 | 1.4 |

EXAMPLES 26-28

A series of three lower melting crystallizable glasses was prepared by the procedures of Example 1 except that heating of the melt was conducted at 1300° C. and they were ball milled for 17 hours. The three glasses had the below indicated composition and surface areas:

TABLE 7

Crystallizable Glass Properties

| | Example No. | | |
|---|---|---|---|
| | 26 | 27 | 28 |
| | (% Wt.) | | |
| ZnO | 40.8 | 30.6 | 32.2 |
| $B_2O_3$ | 18.4 | 18.4 | 19.3 |
| $SiO_2$ | 15.3 | 15.3 | 10.7 |
| PbO | 25.5 | 35.7 | 37.6 |
| Surface Area, $m^2/g$ | | 1.61 | 1.62 |

EXAMPLE 29

A thick film encapsulant composition was made by admixing 70 g of the glass of Example 27 with 2.1 g of $Cr_2O_3$ colorant and 0.3 g tridecyl phosphate wetting agent and dispersing the mixture in an organic medium consisting of 50% wt. dibutyl Carbitol [1] as solvent and 50% wt. poly(alpha-methylstyrene) as resin. The resultant paste mixture was screen printed over a series of previously prepared lead bismuth ruthenate resistors having resistivity values from 10 ohms to 100K ohms and copper electrodes. The printed paste was then fired at 600° C. in nitrogen atmosphere. A smooth hermetic film with no stain on the copper electrodes was obtained in every instance. Furthermore, the shift in resistivity of the underlying resistors was quite acceptably small as is shown in Table 7 below:

TABLE 8

Effect of Encapsulation on Resistance Shift

| Resistivity (ohms/sq) | 10 | 100 | 10K | 100K |
|---|---|---|---|---|
| % Shift | 4.3 | 3.0 | 0.8 | neg. 0.04 |

(1) Carbitol is a trademark of Union Carbide Corporation, Danbury, CT for mono- and di-alkyl ethers of diethylene glycol and their derivatives. Dibutyl Carbitol is diethylene glycol dibutyl ether.

EXAMPLES 30 and 31

Two thick film pastes were prepared from the encapsulant composition referred to above which had the following composition by weight: 61.2% ZnO, 18.4% $B_2O_3$, 15.3% $SiO_2$ and 5.1% PbO. The thick film pastes consisted by weight of 74.7% glass, 21.3% liquid medium, 2.4% $Cr_2O_3$, 1.2% $TiO_2$ filler and 0.3% tridecyl phosphate wetting agent.

One of the pastes was formulated with a 50/50 by weight solution of poly(alpha-methylstyrene)[1] and dibutyl Carbitol and the other in a medium consisting of Dowanol PPH[2]. The pastes were each roll milled and tested as to viscosity stability with a Brookfield HBT Viscometer having a No. 14 Spindle.

The paste made with the propylene glycol phenyl ether had very poor rheology for printing and its viscosity was so unstable that no meaningful readings could be obtained.

On the other hand, the paste using the medium containing poly(alpha-methylsytrene) and dibutyl Carbitol had good rheology for printing and had a stable viscosity as can be seen from the data in the following table:

| Spindle Speed (rpm) | Viscosity (Pa.S) |
|---|---|
| 1 | 250 |
| 10 | 55 |
| 100 | 25 |

(1) Amoco PAMMS, a trademark of Amoco Chemical Co., Chicago, IL for poly (alpha-methyl styrene) resin.
(2) Dowanol PPH is a trademark of Dow Chemical Co., Midland, MI for propylene glycol phenyl ethers.

EXAMPLES 32 and 33

Two thick film encapsulant compositions were made by admixing the glasses from Examples 30 and 31 with an organic medium comprising ethyl cellulose as resin and terpineol as solvent. The resultant pastes were screen printed and fired in air at 600° C. over lead bismuth ruthenate resistors having gold electrodes. The four resistors exhibited quite low resistance shifts as is shown by the data in Table 9 which follows:

TABLE 9

Effect of Encapsulation on Resistance Shift

| | | Resistance Shift (%) |
|---|---|---|
| Glass ex. Example 30, | Resistor A | 2.4 |
| | Resistor B | 4.6 |
| Glass ex. Example 31, | Resistor A | 4.1 |
| | Resistor B | 3.9 |

EXAMPLES 34-36

Five glasses in accordance with the invention were made by the procedure of Example 1 and were tested by Differential Thermal Analysis[3] in air to determine their sintering and crystallizing temperatures. The data in Table 10 show that the first three glasses had similar crystallization onset temperatures and they sintered between 450° and 600° C.

TABLE 10

Encapsulant Properties

| | Example No. | | | | |
|---|---|---|---|---|---|
| | 34 | 35 | 36 | 37 | 38 |
| Composition, % Wt. | | | | | |
| ZnO | 61.2 | 30.6 | 32.2 | 25.6 | 20.7 |
| $B_2O_3$ | 18.4 | 18.4 | 19.3 | 18.4 | 18.4 |
| $SiO_2$ | 15.3 | 15.3 | 10.7 | 15.3 | 15.3 |
| PbO | 5.1 | 35.7 | 37.6 | 40.6 | 45.5 |
| Sintering Temperature, °C. | 580 | 500 | 480 | 480 | — |
| Crystallization Onset Temperature, °C. | 760 | 760 | 760 | 563 | — |

(3) Du Pont Instrument 910 Differential Scanning Calorimeter with 1600° C. DTA cell, product of E. I. du Pont de Nemours & Co., Wilmington, DE 19898.

The glasses of Examples 37 and 38 were printed over ruthenate-type resistors, terminated with thick-film copper and fired at 590° and 600° C. (4 minutes at peak temperatures) in a belt furnace having a $N_2$ atmosphere. Both glasses form smooth glazes. However, as shown in Table 11, the Example 37 glass exhibited lower resistance shift at both 10 and 100 ohms.

TABLE 11

Resistance Shift of Encapsulant Glasses

| | Example No. | |
|---|---|---|
| | 37 | 38 |
| Resistance Shift, % | | |
| 10 ohms when fired at 590° C. | 1.6 | 18 |
| 10 ohms when fired at 600° C. | 2.5 | 9.5 |
| 100 ohms when fired at 590° C. | 5.1 | 6.6 |
| 100 ohms when fired at 600° C. | 8.4 | 8.9 |

EXAMPLE 39

A glass was prepared in accordance with the teaching of the Pirooz, U.S. Pat. No. 3,088,834 having the composition by weight of 60.0% ZnO, 18.0% $PbO_3$, 15.0% $SiO_2$, 5.0% PbO and 2.0% CuO. The glass was milled in isopropanol and dried and pastes were formed thereon using both a cellulosic vehicle and an acrylic vehicle. Both pastes were then printed over already formed resistors having copper circuitry and fired at 60° C. While the resulting films were smooth they nevertheless had distinct areas of metallic red color which indicates the presence of proper metal from the reduction of the copper oxide in the glass. Probing of the discolored areas with an ohm meter showed that they exhibited highly resistive conduction. Thus, though the films appeared to be dense and hermetic, they would be of no value as encapsulants for electronic circuitry because of their low insulation resistance.

I claim:

1. An encapsulating green tape consisting of a cast layer of a dispersion of finely divided particles of a crystallizable glass consisting essentially by weight of 20–65% ZnO, 10–22% $B_2O_3$, 13–40% $SiO_2$ and 3–46% PbO in a matrix of solid acrylic polymer.

* * * * *